US010096555B2

(12) United States Patent
Gulpen et al.

(10) Patent No.: US 10,096,555 B2
(45) Date of Patent: Oct. 9, 2018

(54) SHIELDED QFN PACKAGE AND METHOD OF MAKING (71) Applicant: NXP B.V., Eindhoven (NL)

(72) Inventors: Jan Gulpen, Nijmegen (NL); Leonardus Antonius Elisabeth van Gemert, Nijmegen (NL)

(73) Assignee: NXP B.V., Eindhoven (NL)

( * ) Notice: Subject to any disclaimer, the term of this patent is extended or adjusted under 35 U.S.C. 154(b) by 96 days.

(21) Appl. No.: 15/464,016

(22) Filed: Mar. 20, 2017

(65) Prior Publication Data
US 2017/0213797 A1 Jul. 27, 2017

Related U.S. Application Data (62) Division of application No. 14/806,486, filed on Jul. 22, 2015, now Pat. No. 9,653,414.

(51) Int. Cl.
H01L 21/78 (2006.01)
H01L 21/48 (2006.01)
(Continued)

(52) U.S. Cl.
CPC ...... H01L 23/552 (2013.01); H01L 21/32051 (2013.01); H01L 21/4825 (2013.01); H01L 21/52 (2013.01); H01L 21/561 (2013.01); H01L 21/565 (2013.01); H01L 21/78 (2013.01); H01L 23/3107 (2013.01); H01L 23/3114 (2013.01); H01L 23/4952 (2013.01); H01L 23/49503 (2013.01); H01L 23/49541 (2013.01); H01L 23/49548 (2013.01); H01L 23/49575 (2013.01); H01L 23/60 (2013.01); H01L 24/97 (2013.01); H01L 23/3121 (2013.01); H01L 24/32 (2013.01); H01L 24/45 (2013.01); H01L 24/48 (2013.01); H01L 24/73 (2013.01); H01L 24/92 (2013.01); H01L 2224/32245 (2013.01); H01L 2224/45014 (2013.01);
(Continued)

(58) Field of Classification Search
CPC ......... H01L 21/52; H01L 21/56; H01L 21/78; H01L 21/561; H01L 21/565; H01L 21/3205; H01L 21/4825; H01L 21/48; H01L 21/486; H01L 21/4889
USPC ........................................................ 257/659
See application file for complete search history.

(56) References Cited

U.S. PATENT DOCUMENTS

2011/0177657 A1* 7/2011 Itou ..................... H01L 21/4828
438/123
2012/0108013 A1* 5/2012 Fujisawa ............. H01L 21/4842
438/123

* cited by examiner

Primary Examiner — Chuong A Luu (57) ABSTRACT

Consistent with an example embodiment, a semiconductor device comprises a device die having bond pads providing connection to device die circuitry and a QFN half-etched lead frame with a package boundary; the QFN half-etched lead frame has a top-side surface and an under-side surface. The QFN half-etched lead frame includes a sub-structure of I/O terminals and a die attach area, the die attach area facilitating device die attachment thereon and the terminal I/O terminals providing connection to the device die bond pads and additional terminals located about the corners of the sub-structure. An envelope of molding compound encapsulates the device die mounted on the top-side surface of the QFN half-etched lead frame. A RF (radio-frequency) shield layer is on the envelope of the molding compound, the RF shield electrically connected to the additional terminals via conductive connections defined in corresponding locations on the envelope of the molding compound.

19 Claims, 6 Drawing Sheets (51) Int. Cl.
*H01L 23/552* (2006.01)
*H01L 23/60* (2006.01)
*H01L 23/495* (2006.01)
*H01L 23/31* (2006.01)
*H01L 21/56* (2006.01)
*H01L 21/52* (2006.01)
*H01L 21/3205* (2006.01)
H01L 23/00 (2006.01)

(52) U.S. Cl.
CPC ............... *H01L 2224/48247* (2013.01); *H01L 2224/73265* (2013.01); *H01L 2224/92247* (2013.01); *H01L 2224/97* (2013.01)

SHIELDED QFN PACKAGE AND METHOD OF MAKING

CROSS-REFERENCE TO RELATED APPLICATIONS

This application is a divisional of U.S. patent application Ser. No. 14/806,486 having a filing date of Jul. 22, 2015 now U.S. Pat. No. 9,653,414, common inventors, common assignee, which is incorporated by reference in its entirety.

FIELD

The embodiments of the present invention relate to semiconductor device packaging and, more particularly, to a QFN (quad flat-pack no-leads) packaging having modifications that provide RF (radio frequency) shielding to active device die packaged therein.

BACKGROUND

The electronics industry continues to rely upon advances in semiconductor technology to realize higher-function devices in more compact areas. For many applications realizing higher-functioning devices requires integrating a large number of electronic devices into a single silicon wafer.

Further, as more devices are manufactured on a given substrate size, there exists a need to enhance the packaging of those devices so that performance and functionality are maintained.

SUMMARY

The present disclosure has been found useful in the packaging of semi-conductor devices which find their way into portable electronic devices. In particular, QFN (quad flat-pack no-leads) products may be provided to manufacturers of mobile devices. The devices may have RF circuits therein or be situated near RF components on the system board. These RF circuits require shielding to prevent undesired electro-magnetic (EM) interference to nearby components. For example, in some mobile devices, phones in particular, EM shielding is performed by placing offending components in metal cans. On a package level, the EM shielding may be performed by applying metal caps to the package. In both examples, to be effective, the EM shield needs to be connected to ground. However, these present solutions increase the vertical profile of the RF circuit in an environment having limited valuable space requiring systems designed with maximum performance and features.

There is a need for a packaging alternative that provides EM shielding from nearby RF components and the overall operating environment. Particular terminal I/O pads are defined as RF shielding pads, such as ground. As the device is assembled and encapsulated in a molding compound, the corresponding locations of the RF shielding pads are noted. Holes are drilled through the molding compound to expose the RF shielding pads. A suitable metal is sputtered onto the exposed surfaces of the packaged device, and fills in the RF shielding holes. The metal provides a shield (i.e. a "Faraday cage") encompassing the device to either prevent EMI from the packaged device or shield the packaged device from external EMI.

In an example embodiment, there is semiconductor device that comprises a device die having bond pads providing connection to device die circuitry and a QFN half-etched lead frame with a package boundary. The QFN half-etched lead frame has a top-side surface and an under-side surface and the QFN half-etched lead frame includes a sub-structure of I/O terminals and a die attach area; the die attach area facilitates device die attachment thereon and the terminal I/O terminals provide connection to the device die bond pads. Additional terminals are located about the corners of the sub-structure. An envelope of molding compound encapsulates the device die mounted on the top-side surface of the QFN half-etched lead frame. There is a RF shield layer on the envelope of the molding compound; the RF shield is electrically connected to the additional terminals via conductive connections defined in corresponding locations on the envelope of the molding compound.

In another example embodiment, a plurality of semiconductor devices are assembled in a QFN half-etched lead frame array having a top-side surface and an under-side surface, the QFN lead frame array having a plurality of device die positions, the device die position having a boundary, upon the top-side surface, and a plurality of device die are assembled thereon. The plurality semiconductor devices comprises a plurality of sub-structures. Each sub-structure includes I/O terminals and a die-attach area; the die-attach area facilitates device die attachment thereon and the terminal I/O terminals provide connection to device die bond pads of each of the plurality of device die. Additional terminals are located about the corners of the sub-structure, the additional terminals are optionally electrically connected to the die-attach area. An envelope of molding compound encapsulates the plurality device die mounted on the plurality of device die positions of the QFN half-etched lead frame array. A RF shield layer on the envelope of the molding compound, the RF shield electrically connected to the additional terminals via conductive connections defined in corresponding locations on the envelope of the molding compound at each one of the plurality of sub-structures.

In an example embodiment, there is method of manufacturing a semiconductor device in a QFN half-etched lead frame package, the semiconductor device having radiofrequency (RF) shield. The method comprises configuring the QFN half-etched lead frame with grounding pads at each corner and optionally connecting these grounding pads to a die-attach region. A device die is mounted on the die-attach region and the device die is assembled on the QFN half-etched lead frame. The device is encapsulated in a molding compound. Holes are drilled in the molding compound in locations corresponding to the grounding pads at each corner and drilling proceeds until surfaces of the grounding pads are exposed, thereby defining through-hole positions. Metal is sputtered onto the encapsulated device, whereby the sputtered metal plates vertical surfaces of the holes as the sputtered metal covers the molding compound and electrically connects to the grounding pads via the plated vertical surfaces of the holes at the through-hole positions.

The above summaries are not intended to represent each disclosed embodiment, or every aspect, of the present disclosure. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present disclosure has been found useful in providing a device assembled in a QFN package with RF shielding so as to protect the device from EMI. Such shielding is useful in mobile portable products in which integrated circuits and other components are placed in tight proximity to one another. Present solutions of placing vulnerable or offending components in external metal cans or applying external supplemental metal caps to the package may not be suitable in an environment having limited valuable space requiring systems designed with maximum performance and features.

Relatively inexpensive QFN lead frames may modified to include grounding terminals to which RF shielding may be applied. In one aspect, modification may involve the selecting grounding pins; and these grounding pins have holes defined therein after the device has been encapsulated in a molding compound. Metallization is applied and coats the external surfaces of the device and fills in the holes. The filled holes and coated external surfaces are connected to ground on the end user's printed circuit board.

In an example embodiment, the holes are drilled through the compound but not necessarily entirely drilled through the lead frame, they may stop at the surface of the lead frame, allowing the shield to contact the lead frame surface. In another example embodiment, the drill may just also go slightly into the lead frame. In either case, electrical contact between the RF shielding and the lead frame is enhanced.

For a QFN package having RF shielding, the shielding may be a sputtered metal coating. The metal coating covers the top surface of the encapsulated QFN package and covers the vertical faces of the package. This metal coating may be connected to ground terminals which in turn are connected to a user's sub-system printed circuit board (PCB).

Package dimensions can vary from about 1×1 mm to about 10×10 mm and all dimensions in between and perhaps larger. Manufacturing format is in the range of about 70 mm×250 mm to 100×300 mm. Depending upon the package size several hundred to thousands of products can be processed and (sputter) coated simultaneously. Further, the pin count can vary from two to about a hundred.

A number of metals may be sputtered onto the package according to the present disclosure, these may include, but not necessarily limited to titanium (Ti), nickel (Ni), vanadium (V), copper (Cu), or stainless steel. Stainless steel may be used as a last layer, over the sputter coatings of other metals, as a corrosion inhibitor.

Figure 1A:
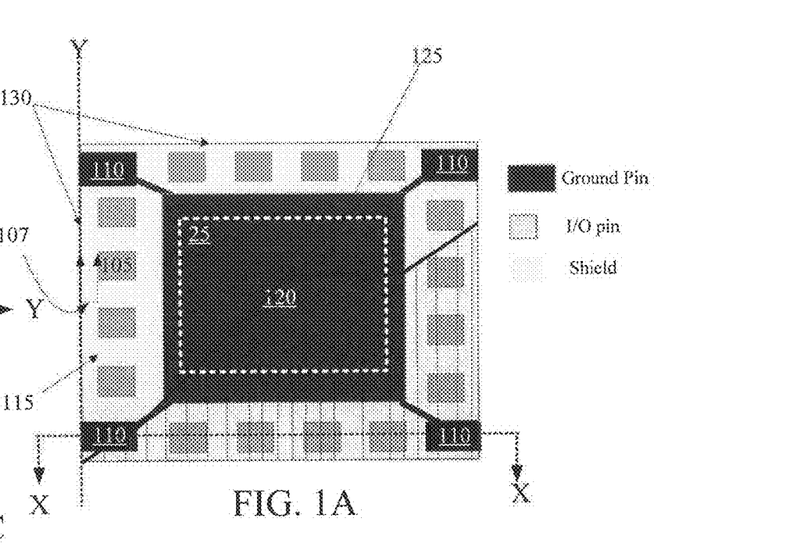
FIGS. 1A-1C in a series of views depict a QFN package, having leads without exposed vertical surfaces at the package edges, configured according to an embodiment of the present disclosure.
Figure 1B:
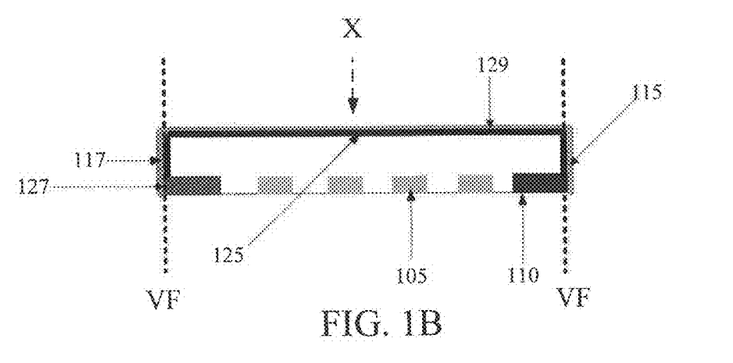
Figure 1C:
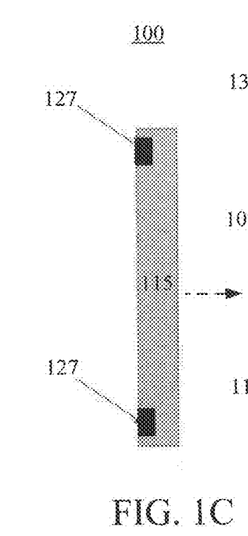

Refer to FIGS. 1A-1C. In an example embodiment, a QFN packaged device 100 configured according to the present disclosure has RF shielding applied. The device die 25 is placed on a die attach area 120. The die attach area 120 is surrounded by bond pads 105. Four additional pads 110 are optionally electrically connected to the die attach area 120. In some applications these additional pads 110 may be connected to ground but not to the die attach area 120. The device die 25 is electrically connected to the bond pads 105 with wire or ribbon bonds (not illustrated). The bond pads 105 are surrounded by a device boundary 130. The bond pads 105 are separated by a distance 107 from the device boundary 130. The additional pads 110 are co-planar with the device boundary 130 and vertical faces 127. As shown in FIG. 1B, the device die 25 is encapsulated in a molding compound 125. Upon the molding compound 125 an RF shield 115 has been applied. The RF shield coats the molding compound 125 on its topside surface 129 and the vertical face 127 of the ground terminal 110 and vertical face 117 of the molding compound 125 (as denoted by dashed line VF). Refer to FIG. 1C. Thus, the RF shield 115 is coupled to the additional pads 110. The user may then attach the device to his sub-system board which grounds these additional pads 110. The QFN device 100 has an RF shield 115 to isolate the device from EMI.

In an example process, an array of devices having been assembled and encapsulated, are singulated. The singulated devices are placed on a temporary carrier and the RF shield is sputtered on.

Figure 2A:
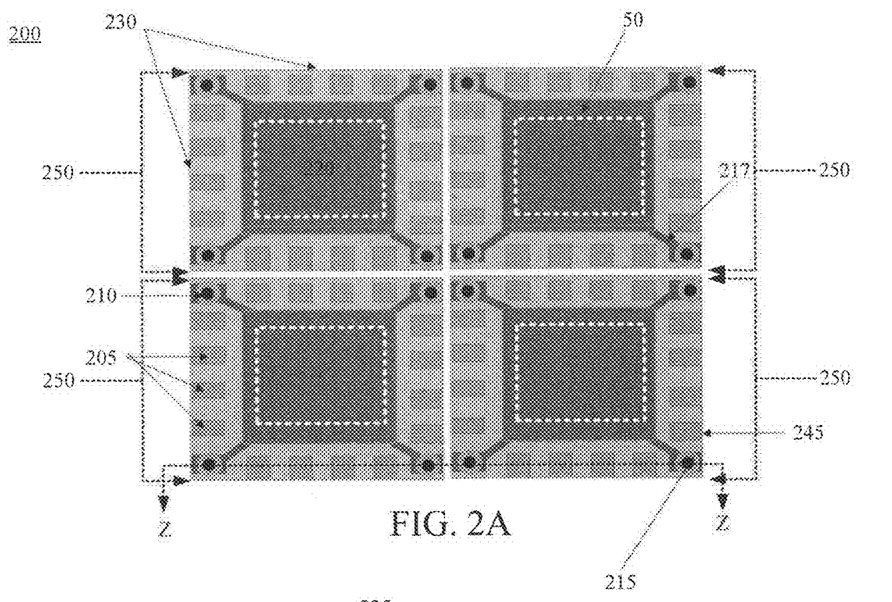
FIGS. 2A-2B depict a QFN package configured according to an embodiment of the present disclosure.
Figure 2B:
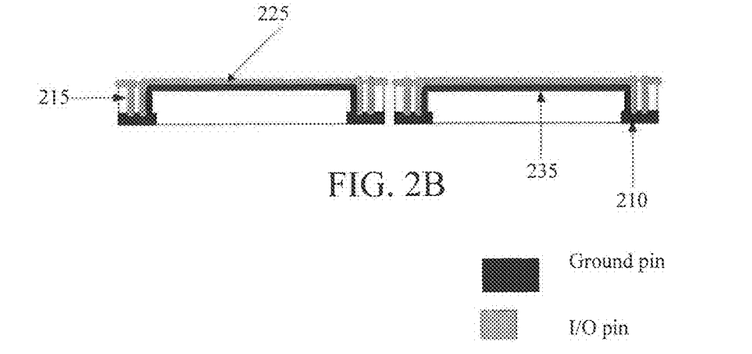

Refer to FIGS. 2A-2B. In an example embodiment, an array 200 of QFN devices 250 is configured with RF shielding for each of the device die 50 (as shown by dashed lines). Although four devices 250 are arrayed, there is no limit on the number of devices which may be arrayed. The specific number would depend upon the number of I/O terminals, device die size, manufacturing tooling dimensions, etc. Each device 250 has four through holes 215 defined at the corners, the through holes 215 are electrically connected to ground terminals 210 by sputtering. In this embodiment, the ground terminals 210 are connected by traces 217 to the die attach area 220. In another example embodiment, these ground terminals 210 may be isolated from the die attach area 220. The vertical faces 245 of bond pads 205 are coplanar with the device boundary 230. The RF shield 225 is applied to the array 200 devices 250 after their encapsulation in a molding compound 235. After the application of the RF shield 220, the array 200 of devices 250 are singulated into individual devices. Unlike the example described in FIG. 1, there would not be any RF shielding 225 on the vertical faces of the individual device in that the bonding pads, which ultimately become the I/O terminals, are coplanar with device boundary 230; the RF shielding 225 if applied possibly could short-circuit the I/O terminals.

Figures 3A, 3B:
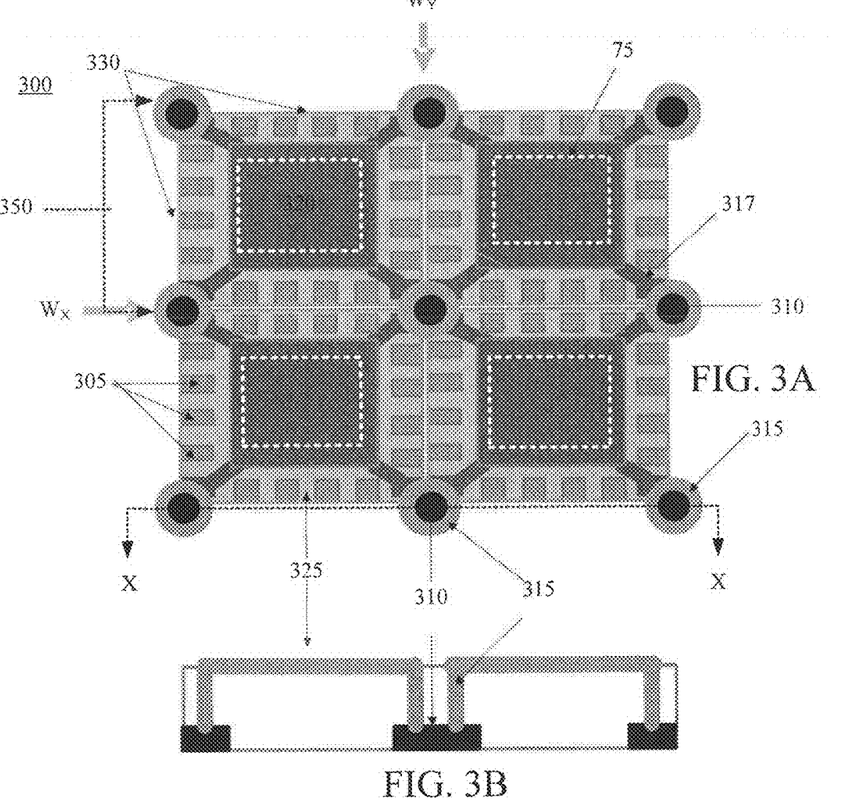
FIGS. 3A-3C in a series of views, depict a QFN package configured according to an embodiment of the present disclosure.
Figure 3C:
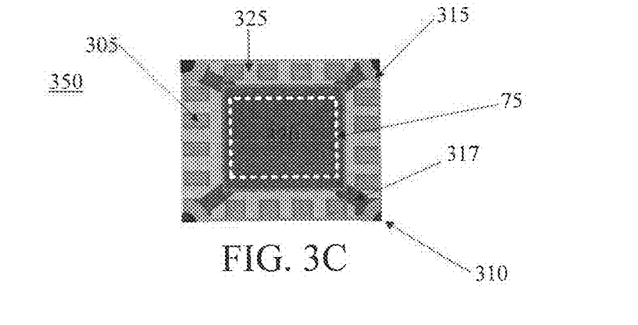
Figure 4A:
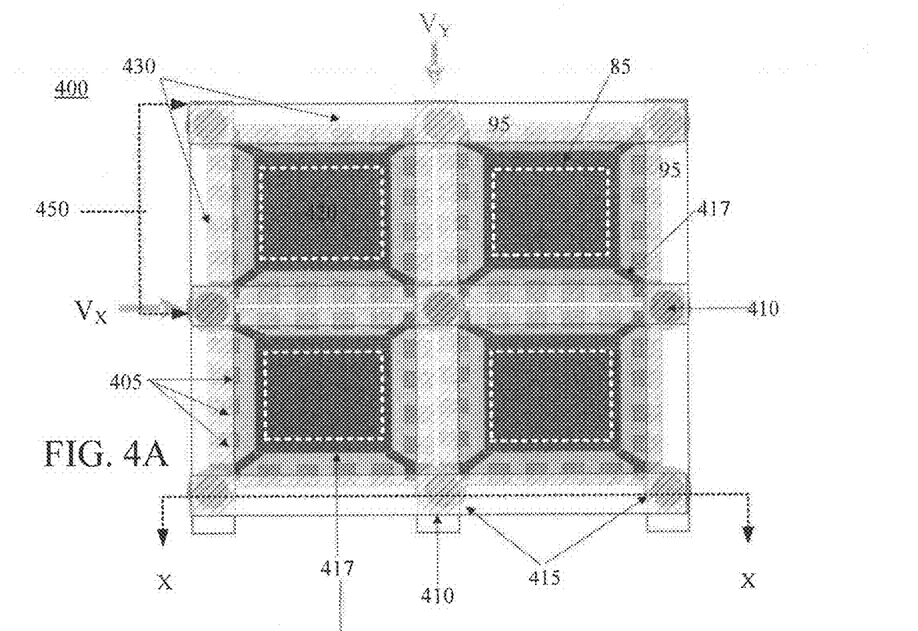
FIGS. 4A-4D in a series of views, depicts a QFN package configured according to an embodiment of the present disclosure.
Figure 4B:
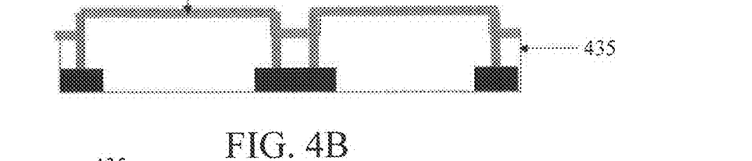
Figure 4C:
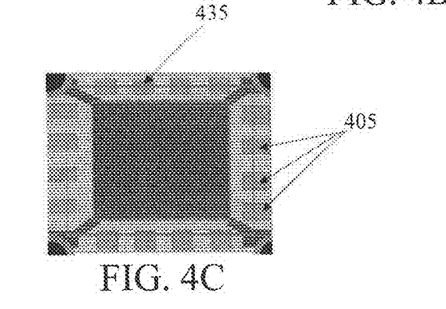
Figure 4D:
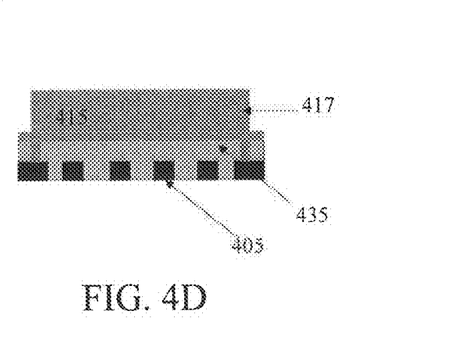

Refer to FIGS. 3A-3C. In an example embodiment, an array 300 of QFN devices 350 is configured with RF shielding for each of the device die 75. The device die 75 is wire bonded to the bond pads 305 so that I/O terminals are defined. In contrast to the array 200 of FIG. 2, each device 350 shares (at each corner) a through-hole 315 with four adjacent devices 350. These corners are the cross point of the two saw lanes in the X-direction and the Y-direction, as shown by arrow $W_x$ and arrow $W_y$. Thus, each device 350 has a "quarter portion" a through-hole 315 connected to ground pads 310. Traces 317 connect the die attach area 320 to the ground pads 310. In another example embodiment, the die attach area 320 may be isolated from these ground pads 310. The RF shield 325 is connected to these ground terminals 310 via the sputter coated through-holes 315. Sputtering is capable of filling in both the horizontal and vertical surfaces of the through-holes. The use of a larger through-hole 315 results in fewer holes drilled in the molding compound; the embodiment of FIGS. 3A-3C uses only one fourth the number of holes as that of the embodiment outlined in FIGS. 2A-2B. Specific technical and process requirements would dictate the favoring of one structure over another.

The example package of FIG. 1 has sputtering on the device's edges in contrast to the example packages of FIGS. 2A-2B and FIGS. 3A-3C. Not having the sputtering connecting the edges of the device with the shield may have some effect on the shielding, but such effect is likely negligible; the area not covered is <<1 mm. However, the examples of FIGS. 2A-2B and FIG. 3A-3C require less processing.

In an example embodiment, in an effort to enhance the shielding on the edges of the device, encapsulated devices in the lead frame array may undergo a process in which a wide trench is defined in the saw lanes. The wide trench exposes the vertical faces of individual devices so that the top surface and vertical side surfaces of the devices receive the sputtered metal.

Refer to FIGS. 4A-4D. An array 400 of QFN devices 450 is configured with RF shielding for each of the device die 85. The device die 85 is wire bonded to the bond pads 405 so that I/O terminals are defined. Each device 450 shares (at each corner) a through-hole 415 with four adjacent devices 450. The array of QFN devices is enveloped in a molding compound 435. The corners are the cross point of the two saw lanes in the X-direction and the Y-direction, as shown by arrow $V_x$ and arrow $V_y$. Thus, each device 450 has a "quarter portion" a through-hole 415 connected to ground pads 410. Traces 417 connect the die attach area 420 to the ground pads 410. In another example embodiment, the die attach area 420 may be isolated from these ground pads 410. The RF shield 425 is connected to these ground terminals 410 via the sputter coated through-holes 415. Sputtering is capable of filling in both the horizontal and vertical surfaces of the through-holes. The use of a larger through-hole 415 results in fewer holes drilled in the molding compound. As with the embodiment of FIGS. 3A-3C, the embodiment of FIGS. 4A-4D uses only one fourth the number of holes as that of the embodiment outlined in FIGS. 2A-2B.

In contrast to FIGS. 3A-2C, the array 400, after the encapsulation in molding compound 435, a wide cut 95 is defined in the saw lanes in the X and Y directions. The wide cut 95 to a predetermined depth, substantially removes most of the molding compound, thereby exposing vertical faces 417 of individual devices. In one example process the depth of the cut may defined to leave about 100 µm of molding compound above the lead frame array 400 in the saw lanes so as to provide sufficient mechanical strength during production handling. There will be sufficient exposure of the vertical faces 417 to the sputtered metal of the RF shield 415.

Figure 5:
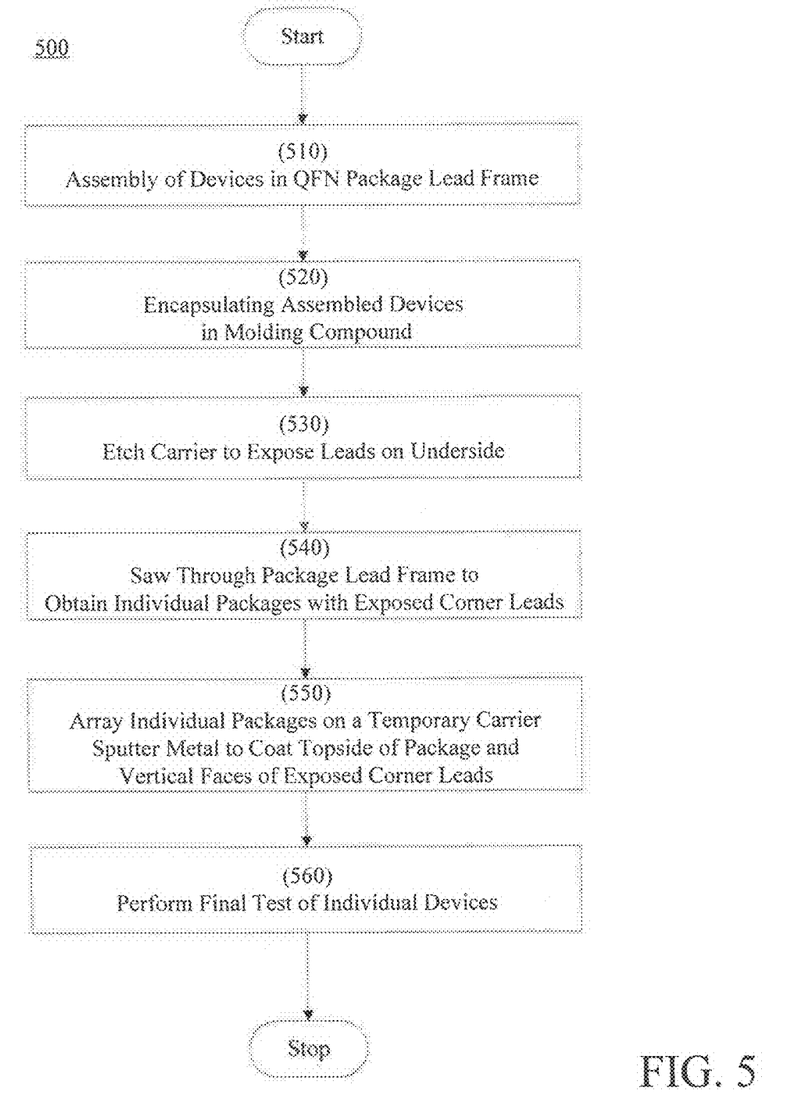
FIG. 5 depicts a flow diagram of a process for assembling a QFN package of FIG. 1.

Refer to FIG. 5. In an example process 500, an integrated circuit device (as discussed in connection with FIGS. 11A-1C) is assembled in a QFN package according to embodiments of the present disclosure. In step 510, device die are bonded and wire bonded into the QFN lead frame assembly. In step 520, the assembled devices are encapsulated in a molding compound. An etching process, in step 530, exposes the leads on the underside of the package. In step 540, the package lead frame is sawed through to obtain individual packages with exposed corner leads. The individual packaged devices are arrayed onto a temporary carrier and metal is sputtered on to coat the exposed topside of the package and vertical faces of the exposed corner leads, in step 550. As required by the end user, in step 560, a final electrical test may be performed on the completed individual devices.

Figure 6:
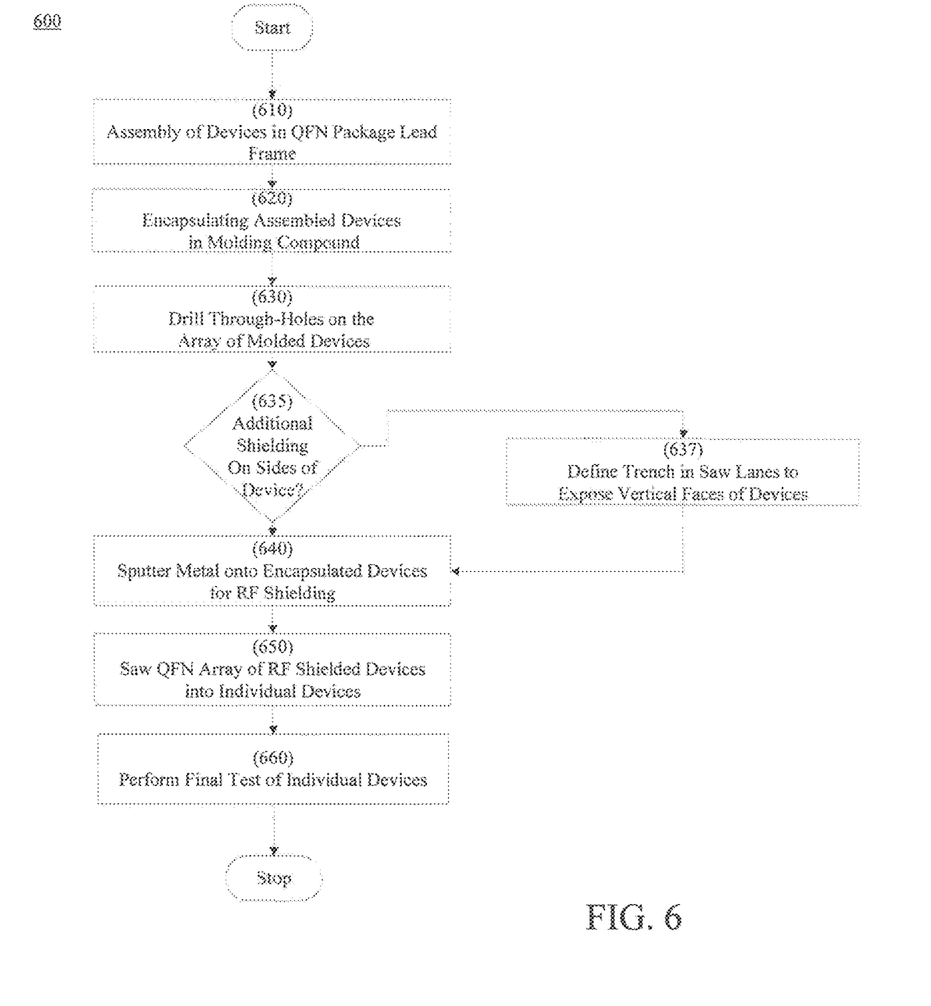
FIG. 6 depicts a flow diagram of a process for assembling a QFN package of FIGS. 3A-3C and FIGS. 4A-4D configured according to the present disclosure.

Refer to FIG. 6. In another example process 600, an integrated circuit device is assembled in a QFN package according to embodiments of the present disclosure. In step 610, device die are bonded and wire bonded into the QFN lead frame assembly. The lead frame assembly has ground pads defined for the RF shielding for each device die location. These ground pads may be placed in the corners or other locations, for example, in the mid-point between each row of I/O terminals on each of the four sides of the device die position. In step 620, the assembled devices are encapsulated in a molding compound. In step 630, holes are drilled in the molding compound in locations corresponding to the ground pads. From the example embodiments discussed, the holes drilled may be one at each corner for small holes, or one large hole crossing the corners of four adjacent device positions. The drilling may be accomplished with a laser or other technique of suitable precision and accuracy. After drilling, in step 635, there may be a requirement for additional shielding for very high frequency applications and even the small gap of shielding on the vertical faces in previous embodiments may affect performance. In step 637, the unshielded vertical sides can be partially covered by defining a trench in the saw lanes to expose vertical faces of devices before sputtering. The trench may be an additional groove on the saw lane position (somewhat wider that the final saw blade). This groove than also will be covered with the metal shield. This groove can be as deep as some 100-200 um above the lead frame ensuring enough insulation but reducing the unshielded vertical area In step 640, metal, such as copper (Cu) is sputtered onto the encapsulated devices, as required. In step 650, the array of now RF shielded QFN devices is sawed apart in the X and Y direction to obtain individual devices. In step 660, a final electrical test is performed before devices are prepared for shipment to the end user.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Numerous other embodiments of the invention will be apparent to persons skilled in the art without departing from the spirit and scope of the invention as defined in the appended claims.

The invention claimed is:

1. A method of manufacturing a semiconductor device in a QFN half-etched lead frame package, the semiconductor device having radio-frequency (RF) shield, the method comprising:
    configuring a QFN half-etched lead frame with grounding pads at each corner and connecting these grounding pads to a die-attach region;
    mounting a device die on the die-attach region and assembling the device die on the QFN half-etched lead frame;
    encapsulating the device die in a molding compound;
    drilling through-holes in the molding compound in locations corresponding to the grounding pads at each corner, the drilling proceeding until surfaces of the grounding pads are exposed, thereby defining through-hole positions; and
    sputtering metal onto the encapsulated device, whereby the sputtered metal plates vertical surfaces of the through-holes as the sputtered metal covers the molding compound and electrically connects to the grounding pads via the plated vertical surfaces of the through-holes at the through-hole positions.

2. The method as recited in claim 1, further comprising:
    sawing to a pre-determined depth through the molding compound in saw lanes in an X-direction and a Y-direction, thereby exposing vertical faces of the semiconductor device to the sputtered metal.

3. The method as recited in claim 2, wherein the pre-determined depth is a thickness of the molding compound from a top surface of the semiconductor device to a surface of the QFN-half-etched lead frame.

4. The method as recited in claim 2, wherein the pre-determined depth is about 100 µm to about 200 µm from the top surface of the semiconductor device.

5. The method as recited in claim 1, wherein at least one through-hole position is within a package boundary at each corner of the QFN half-etched lead frame.

6. The method as recited in claim 1, wherein the semiconductor device is one of a plurality of semiconductor devices included in a QFN half-etched lead frame array, the through-hole positions are located at cross-points of saw lanes in a first direction and saw lanes in a second direction, whereby each one of the plurality of semiconductor devices has a quarter-portion through-hole position located over one grounding pad at each corner within a package boundary of each semiconductor device.

7. The method as recited in claim 6, wherein the drilling exposes top-side surfaces of four grounding pads of four different semiconductor devices within each through-hole position.

8. The method as recited in claim 1, wherein the device die has a number of bond pads providing connection to device die circuitry, the QFN half-etched lead frame includes I/O terminals providing connection to the device die bond pads, and the I/O terminals are exposed at an under-side surface of the semiconductor device.

9. The method as recited in claim 8, wherein the grounding pads have top-side surfaces that are co-planar with top-side surfaces of the I/O terminals.

10. The method as recited in claim 8, wherein the grounding pads are offset with respect to the I/O terminals such that vertical faces of the grounding pads are coplanar with a package boundary of the semiconductor device, and vertical faces of the I/O terminals are covered with molding compound at the package boundary.

11. The method as recited in claim 10, further comprising:
    sawing through saw lanes in an X-direction and a Y-direction to singulate the semiconductor device from an array of semiconductor devices, wherein vertical faces of the grounding pads are exposed at the package boundary formed by the sawing.

12. The method as recited in claim 8, further comprising:
    sawing through saw lanes in an X-direction and a Y-direction to singulate the semiconductor device from an array of semiconductor devices, wherein vertical faces of the grounding pads and the I/O terminals are exposed at a package boundary formed by the sawing.

13. A method of manufacturing a plurality of semiconductor devices in a QFN half-etched lead frame array that includes a plurality of sub-structures, the semiconductor devices having radio-frequency (RF) shields, the method comprising:
    configuring the QFN half-etched lead frame array with grounding pads at each corner of the plurality of sub-structures and connecting these grounding pads to a die-attach region of each sub-structure;
    mounting a device die on each die-attach region and assembling the device die on each sub-structure of the QFN half-etched lead frame array;
    encapsulating the device die in a molding compound;
    drilling through-holes in the molding compound in locations corresponding to the grounding pads at each corner, the drilling proceeding until surfaces of the grounding pads are exposed, thereby defining through-hole positions; and
    sputtering metal onto the encapsulated device, whereby the sputtered metal plates vertical surfaces of the through-holes as the sputtered metal covers the molding compound and electrically connects to the grounding pads via the plated vertical surfaces of the through-holes at the through-hole positions.

14. The method as recited in claim 13, wherein at least one through-hole position is located over one grounding pad at each corner within a package boundary of each semiconductor device.

15. The method as recited in claim 13, wherein the through-hole positions are located at cross-points of saw lanes in a first direction and saw lanes in a second direction, whereby each one of the plurality of semiconductor devices has a quarter-portion through-hole located over one of the grounding pads at each corner within a package boundary of each semiconductor device.

16. The method as recited in claim 15, wherein the drilling exposes top-side surfaces of four grounding pads of four different semiconductor devices within each through-hole position.

17. The method as recited in claim 13, wherein each device die has a number of bond pads providing connection to device die circuitry, each of the plurality of sub-structures includes I/O terminals providing connection to the device die bond pads, and the I/O terminals are exposed at an under-side surface of the semiconductor device.

18. The method as recited in claim 17, wherein the grounding pads have top-side surfaces that are co-planar with top-side surfaces of the I/O terminals.

19. The method as recited in claim 15, further comprising:

sawing through saw lanes in an X-direction and a Y-direction to singulate the semiconductor device from the plurality of semiconductor devices, wherein vertical faces of the grounding pads are exposed at a package boundary formed by the sawing.

\* \* \* \* \*